(12) United States Patent
Goldrian et al.

(10) Patent No.: US 8,111,516 B2
(45) Date of Patent: Feb. 7, 2012

(54) HOUSING USED AS HEAT COLLECTOR

(75) Inventors: Gottfried A. Goldrian, Boeblingen (DE); Manfred Ries, Boeblingen (DE)

(73) Assignee: International Business Machines Corporation, Armonk, NY (US)

( * ) Notice: Subject to any disclaimer, the term of this patent is extended or adjusted under 35 U.S.C. 154(b) by 131 days.

(21) Appl. No.: 12/502,547

(22) Filed: Jul. 14, 2009

(65) Prior Publication Data

US 2011/0013363 A1    Jan. 20, 2011

(51) Int. Cl.
*H05K 7/20* (2006.01)

(52) U.S. Cl. ........ 361/719; 361/705; 361/720; 361/721; 165/80.1; 165/80.3; 174/16.1; 174/16.3; 174/252

(58) Field of Classification Search .......................... None
See application file for complete search history.

(56) References Cited

U.S. PATENT DOCUMENTS

| | | | |
|---|---|---|---|
| 5,587,882 A * | 12/1996 | Patel | 361/705 |
| 6,166,908 A * | 12/2000 | Samaras et al. | 361/700 |
| 6,577,504 B1 * | 6/2003 | Lofland et al. | 361/709 |
| 7,038,910 B1 * | 5/2006 | Hodge et al. | 361/690 |
| 7,068,510 B2 * | 6/2006 | Crippen et al. | 361/702 |
| 7,095,614 B2 * | 8/2006 | Goldmann | 361/704 |
| 7,099,153 B2 * | 8/2006 | Yazawa | 361/692 |
| 7,312,987 B1 * | 12/2007 | Konshak | 361/679.48 |
| 7,345,885 B2 * | 3/2008 | Boudreaux et al. | 361/721 |
| 7,423,882 B1 * | 9/2008 | Tong | 361/719 |
| 7,755,896 B2 * | 7/2010 | Tamaki et al. | 361/704 |
| 7,808,780 B2 * | 10/2010 | Brunschwiler et al. | 361/679.53 |
| 7,907,412 B2 * | 3/2011 | Tzeng et al. | 361/715 |
| 2008/0225478 A1 | 9/2008 | Goettert et al. | |

* cited by examiner

*Primary Examiner* — Boris Chervinsky
(74) *Attorney, Agent, or Firm* — Cantor Colburn LLP; William A. Kinnaman, Jr.

(57) ABSTRACT

A system for cooling processor assembly is disclosed which comprises a printed circuit board (PCB) with a plurality of heat emitting electronic components and a housing for each PCB with a heat collector. The heat collector is constructed in one-piece material covering the plurality of heat emitting electronic components through heat collecting areas with different heights adapted to the different heights of the electronic components as regard to the PCB surface wherein the heat collecting areas being in thermal contact with the electronic components.

10 Claims, 8 Drawing Sheets

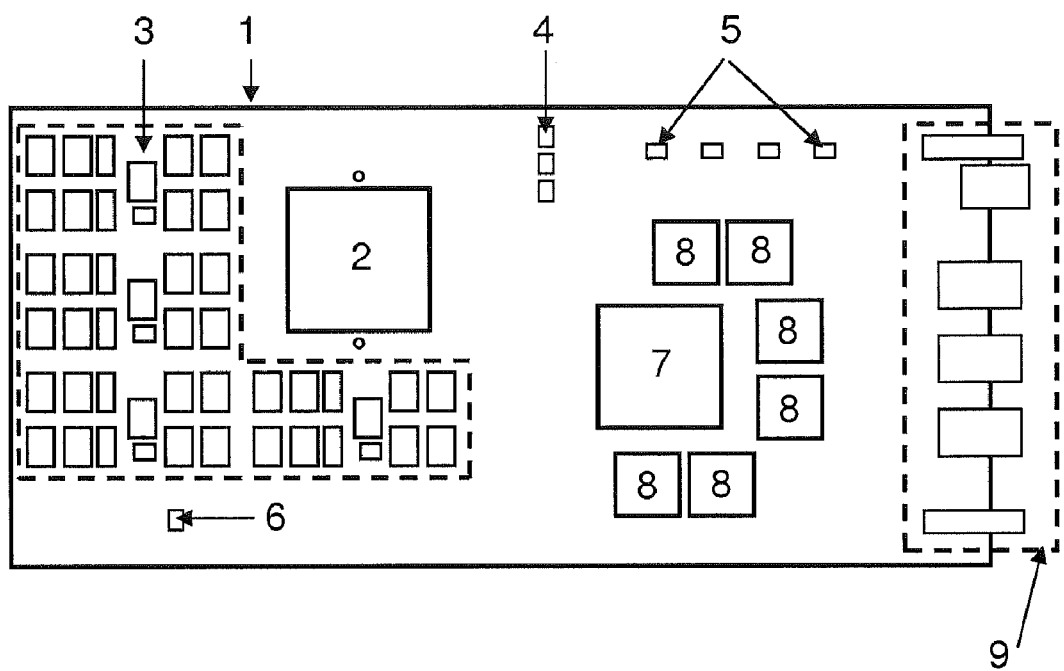
FIG. 1    ( PRIOR ART )

HOUSING USED AS HEAT COLLECTOR

TECHNICAL FIELD

This invention relates to a system for cooling processor assembly comprising printed circuit boards (PCB) with a plurality of heat emitting electronic components. It is also related to an electronics rack with a plurality of such systems for cooling processor assembly.

BACKGROUND OF THE INVENTION

As computers grow in speed and shrink in size, power consumed within the computer per unit volume (power density) increases dramatically. Thus, it becomes essential to dissipate the heat generated by electronic components within the computer during operation to ensure that the components remain within their normal operating temperature ranges, since otherwise the components will fail immediately or will have a significantly shorter lifetime.

One of the most common techniques of dissipating heat from a component of a computer is to directly apply a relatively high velocity air flow across the surface of the component and heatsinks to force cooling the component. This raises the convective heat transfer coefficient for the surface of that component, thereby increasing the convection cooling. Most computers are provided with fans to promote force cooling, thus increasing the temperature differential between the surface of the component and the surrounding air to increase the efficiency of the heat transfer.

Of all components in a computer, the microprocessor central processing unit ("CPU") liberates the most heat during operation of the computer. It has therefore become common practice to provide a heatsink for the CPU to increase the heat-dissipating surface area for more effective cooling. In addition to the heat sink associated with the CPU, a dedicated CPU cooling fan is often used to provide force cooling and air exchange to dissipate the heat generated by the CPU.

Electronic racks comprising stacks of electronic system chassis or multi-blade server chassis are becoming increasingly popular. Such architecture allows to package processors along with their associated electronics in removable drawer or blade configuration disposed within a rack. In general, an electronic rack houses a plurality of thin, modular electronic printed circuit boards PCBs, possibly but not exclusively referred to as server blades. Each PCB may include one or more processors, memory, network controllers, and input/output (I/O) ports, and functions as a server, possibly dedicated to a particular application. In a mainframe environment, one does not necessarily speak of stacking of blade server chassis but the architecture is similar from the point of view of stacks of removable PCB drawers.

Blade servers or PCB drawers in some aspects offer many advantages, e.g., they contain hot-pluggable parts. The hot-plugging technique, sometimes known as hot swapping, enables the repair or replacement of computer systems without disturbing the operation of the total system, i.e., the blades or PCB can be removed without system shutdown. However, there are also disadvantages. One such disadvantage consists in the fact that cooling of these systems is very much complicated due to the amount of CPUs per rack. Thus, more and more so called hotspots, i.e., heat emitting devices share the same cooling flow, which, in general, has for a long time reached its cooling capacity.

To satisfy these increased cooling demands, cooling systems will have to be enhanced taking into account the physical coherences. Currently, the components on the blade are cooled down after a strong heating by convection of air. Due to the enormous generation of heat, air outlet temperatures of more than 50° C. with extremely high air speeds and noise emission will result. This can be controlled by placing a water cooler directly within the air flow, which deprives the strongly warmed air of heat again. Another cooling concept is the so called heat pipe technology, where chips, e.g. CPU, are connected to an air cooled heat sink by heat pipes. A typical heat pipe consists of a sealed hollow tube. A thermo conductive metal such as copper or aluminum is used to make the tube. The pipe contains a relatively small quantity of a "working fluid" or coolant with the remainder of the pipe being filled with vapor phase of the working fluid, all other gases being excluded.

On the internal side of the tube's side-walls a wick structure exerts a capillary force on the liquid phase of the working fluid. This is typically a sintered metal powder or a series of grooves parallel to the tube axis, but it may in principle be any material capable of soaking up the coolant. If the heat pipe has a continual slope with the heated end down, no inner lining is needed. The working fluid simply flows back down the pipe. This type of heat pipe is known as a Perkins Tube. The advantage of heat pipes is their great efficiency in transferring heat. They are actually a vastly better heat conductor than an equivalent cross-section of solid copper. But as the heat is finally transported to air, this technology has no principal advantages over direct air cooling and remains costly.

At least in the professional field of high-performance computers, liquid cooling systems become more and more accepted, their decisive advantage being particularly their high heat intake capacity which is powers of tens higher as compared to air. With respect to blade centers or mainframe computer, two possibilities of liquid cooling can be distinguished. When using rack cooling, the air is cooled by a liquid cooled heat exchanger before the air can leave the rack, or the air is circulated inside the rack in a closed circuit cooled by a liquid cooled heat exchanger. However, this method requires a high energy and special air conditioning systems.

With direct liquid cooling, cooling liquid is directly applied to the respective heat emitting device (electronic components). There is either a single liquid circuit, or a system with primary and secondary liquid circuits. Such a system is disclosed in WO 2006/005325, the invention relating to a heat exchange system for electronic devices, preferably data processing devices, comprising high-performance processors or having high processor density. The heat exchange system comprises essentially a primary cooling circuit and a secondary cooling circuit both being thermally associated to the one or more processor unit(s). The secondary cooling circuit is configured as a completely closed system, the coolant in the secondary cooling circuit being driven exclusively by mechanical or magnetic coupling with the flow drive of the primary cooling circuit. Such alternative has the advantage to allow hot swapping but requires very technically challenging architecture to combine a secondary cooling circuit on each PCB which makes such solution very cost-intensive. Water is circulating inside the possible blade housing and the system shows great installation height. Furthermore, defective pipes or hoses can cause outflow of water that leads to damages to the server (breakdown of the processor and damage to the electronic device, respectively).

Usually, PCBs comprise one or few electronic components like main processor (CPU) which emit heat above average. It is essential to guarantee to evacuate this heat at any time otherwise an irreversible destruction of such electronic components may arise in a very short time (few seconds) due to the extreme heat produced when running. Therefore, cooling mechanism like heat pipes must be brought in the close vicinity of such electronic components to be in a very good thermal contact. Although some Thermal Interface Material (TIM) can be used for thermal connection between electronic components and cooling mechanism. However, the TIM has a relative low thermal conductance compared to metal like aluminum or copper. And only a small gap filled with such material is used in an efficient heat collecting system. In DE20200502749 is disclosed a fixing device with a retaining plate engaged in a holding frame and a leaf spring fastened to the plate. The spring exerts compressive force on a cooling unit guarantying a good thermal contact to the electronic component to be cooled. The plate and the spring are designed in such a manner that tractive forces directed perpendicular to the PCB wearing the electronic component acts on the points of engagement of the plate in the frame, and shear forces directed parallel to the board are received by the plate.

SUMMARY OF THE INVENTION

The shortcomings of the prior art are overcome and additional advantages are provided through the provision of a system for cooling processor assembly, comprising: a printed circuit board (PCB) with a plurality of heat emitting electronic components; and a housing for the PCB comprising a heat collector. The heat collector is constructed in one-piece material covering the plurality of heat emitting electronic components through heat collecting areas with different heights adapted to the different heights of the electronic components as regard to the PCB surface wherein the heat collecting areas being in thermal contact with the electronic components.

The heat collector comprises possibly at least a heat collecting area adjustable in height as regard to the PCB surface. This allows to press this specific heat collecting area against a specific electronic component of the PCB emitting particularly a lot of heat. In such a way, the thermal contact between the heat collector together with its heat adjustable heat collecting area to the plurality of heat emitting electronic components is advantageously guaranteed. In some embodiment according to the invention, the adjustable heat collecting area is pressed against the specific electronic component using a leaf spring placed on the back of the PCB on the height of the specific electronic component and fixed using at least a screw going through the PCB (almost perpendicular to it) to be inserted into a thread at the adjustable heat collecting area. The tightening of the screw presses the adjustable heat collecting area against the specific electronic component in thermal contact allowing an optimal heat transfer from the specific electronic component towards the heat collector. The heat collecting area adjustable in height as regard to the PCB surface consists of a separate part fixed at the heat collector once adjusted against the specific electronic component.

In a further embodiment according to the invention, the heat collector comprises an external base portion to which is transferred heat emitted by the electronic components and which is put into thermal contact with a cooling plate removing heat from the heat collector. Advantageously, the cooling plate can be partly hollow with manifolds for a liquid distribution to carry out heat transferred from the base portion of the housing to the cooling plate.

In an alternative embodiment, the heat collector comprises an external surface with cooling fins.

The invention further relates to an electronics rack with a plurality of systems for cooling processor assembly according to present invention.

Additional features and advantages are realized through the techniques of the present invention. Other embodiments and aspects of the invention are described in detail herein and are considered a part of the claimed invention. For a better understanding of the invention with advantages and features, refer to the description and to the drawings.

BRIEF DESCRIPTION OF THE DRAWINGS

The subject matter which is regarded as the invention is particularly pointed out and distinctly claimed in the claims at the conclusion of the specification. The foregoing and other objects, features, and advantages of the invention are apparent from the following detailed description taken in conjunction with the accompanying drawings in which:

FIG. 1 illustrates a view of a typical PCB with the different heat emitting electronic components;

Figure 2A:
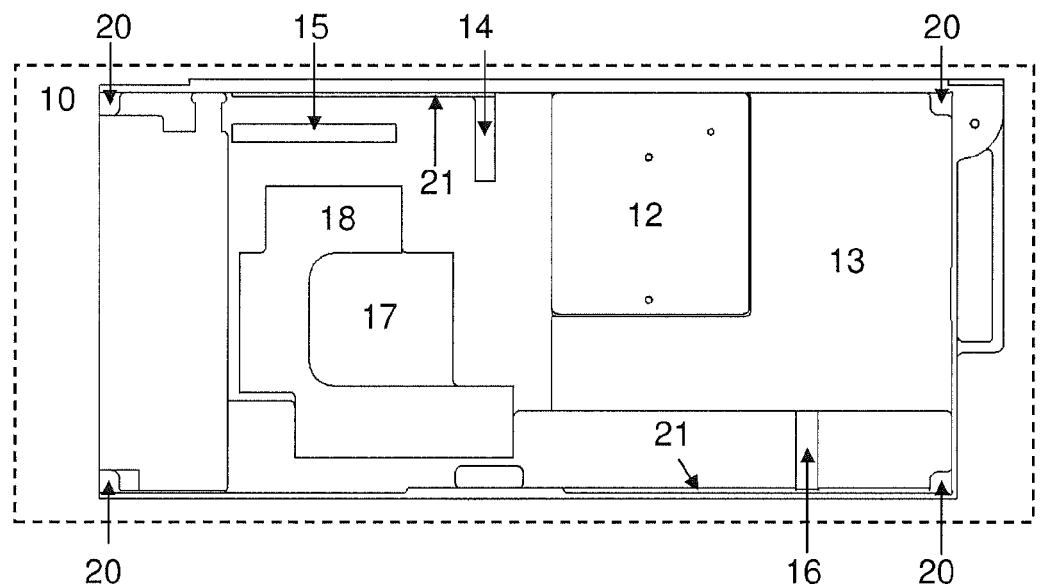
FIGS. 2A and 2B illustrate inside views of the housing for the PCB from FIG. 1 according to the invention.

The detailed description explains the preferred embodiments of the invention, together with advantages and features, by way of example with reference to the drawings.

DETAILED DESCRIPTION OF THE INVENTION

The present invention relates to a system for cooling processor assembly. For simplification of the description of the present invention a processor node of a super computer or main frame is taken as an example of a processor assembly. Such processor node also called in a server environment blade server consists of a PCB with a plurality of heat emitting electronic components and some housing covering at least partly the heat emitting electronic components.

In FIG. 1 is disclosed a typical example of a PCB as used for a processor assembly or processor node 1 within some supercomputer. It comprises a plurality of heat emitting electronic components like the main processor (CPU), memory modules 3, chips 4, voltage regulator modules (VRM) 5, 6, a south bridge 7 and interface modules (PHY) 8. In the case, the heat emitted by the electronic components are evacuated via the small side of the housing (base portion 11, see FIG. 2B) used as cooler interface then it is of advantage to place the processor 2 which dissipates about half of the heat in typical processor system as close as possible to the top corner of the processor node 1. Memory modules emit also a quarter of produced heat but have a relatively large surface for evacuating it allowing to be placed almost every where on the PCB. The VRM for the processor consists of three chips 4. They are close to the processor and very close to the cooling interface i.e. here the base portion 11. The other VRM 5 generates voltages for other components. And the VRM 6 supplies the memory voltage. Some heat compensation must be taken into account for the VRM 6 relatively far away from the cooling interface. On the right side of the PCB is shown the connector area 9 comprising two card guides (at the extremes), one power connector and three signal connectors. Such PCB is plugged into a back plane of a cluster possibly but not necessarily from a supercomputer.

Figure 2B:
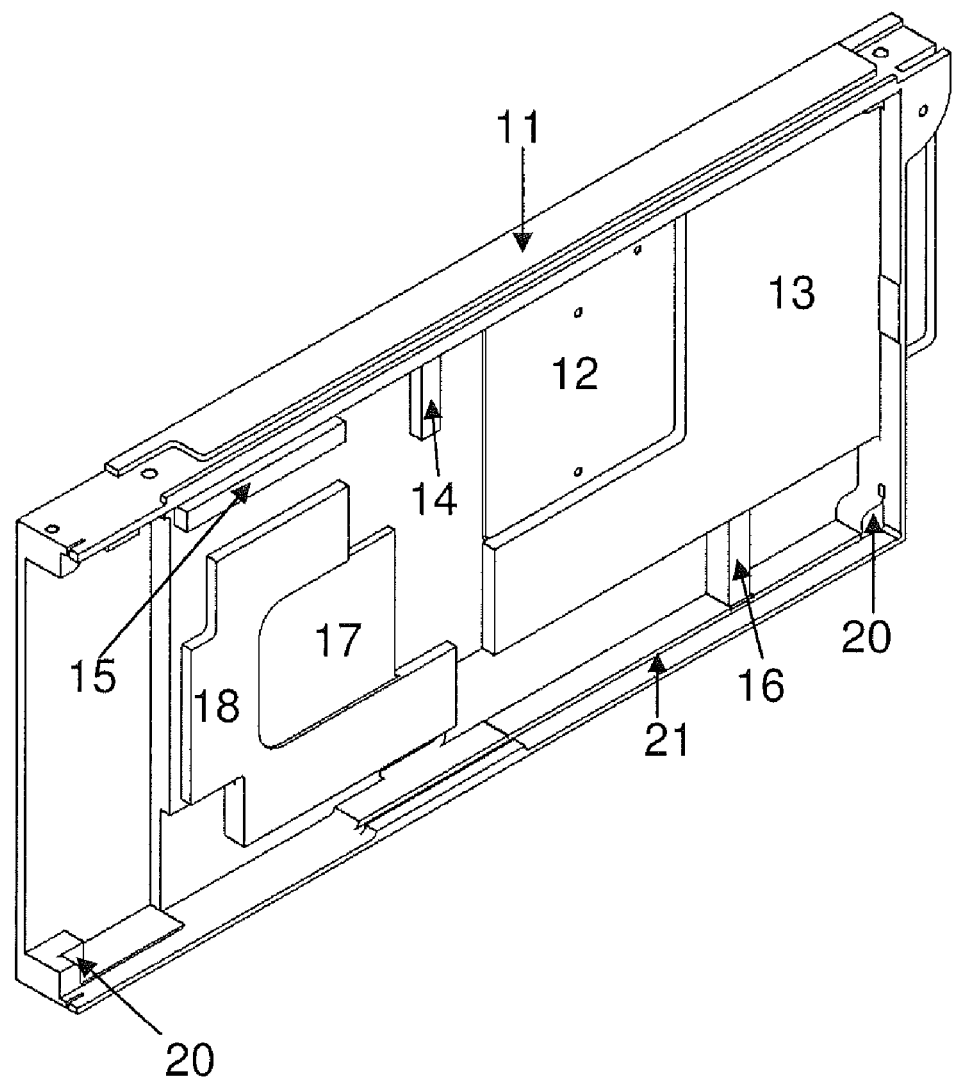

In FIGS. 2A and 2B are shown two different inside view of the housing with the heat collector for such PCB according to the invention. FIG. 2A is a view perpendicular to the main surface of the housing 10. It shows the different specific housing areas 13 to 18 adapted for the different kind of heat emitting electronic components from such PCB 1. In FIG. 2B is shown a perspective view of the inside housing making the different heights of the heat collecting areas from the heat collector clear. The different heights of these areas are defined by the height of the heat emitting electronic components. Apparent is also the heat area 13 for the memory modules 3 which is particularly thick. It is accordingly chosen as compensation to take into account the fact that the memory modules 3 emit almost a quarter of heat.

Four small areas 20 in the corner of the housing and a small rim 21 at the top of the bottom side are support for the PCB 1 when placed into the housing 10. The PCB is flipped horizontally with the heat emitting electronic components pointing to their respective thermal contact areas of the housing. Except the main processor 2 which is pressed to its corresponding specific heat collecting area 12 by a special spring mechanism explained below, all the other heat emitting electronic components 3-8 have no mechanical contact to their respective heat collecting area 13-18 but a thermal contact. For each module type of these electronic components is defined a gap which takes into account module tolerance and the way (material properties) the gap is filled using some TIM. Typically, for the VRM chips 4-6, the gaps to their areas 14-16 are small due to small tolerance for such module. Therefore, the coat of TIM applied is thin while a material with relatively high thermal conductance is chosen. Similar conditions apply for memory modules 3. In contrast, the heat emitted by the interface modules 8 is so low that bigger tolerance can be easily compensated by choosing a bigger gap to their respective heat collecting area 18 of the housing 10. In that case, a thick coat of TIM is used while the TIM itself has to be soft. For the south bridge 7 also not emitting to much heat, a relatively large gap to its respective heat collecting area 17 can be chosen filled with some soft TIM. In the case, south bridges with higher heat emission are chosen then a second heat collecting area adjustable in height (explained below) can also be chosen.

Figure 3:
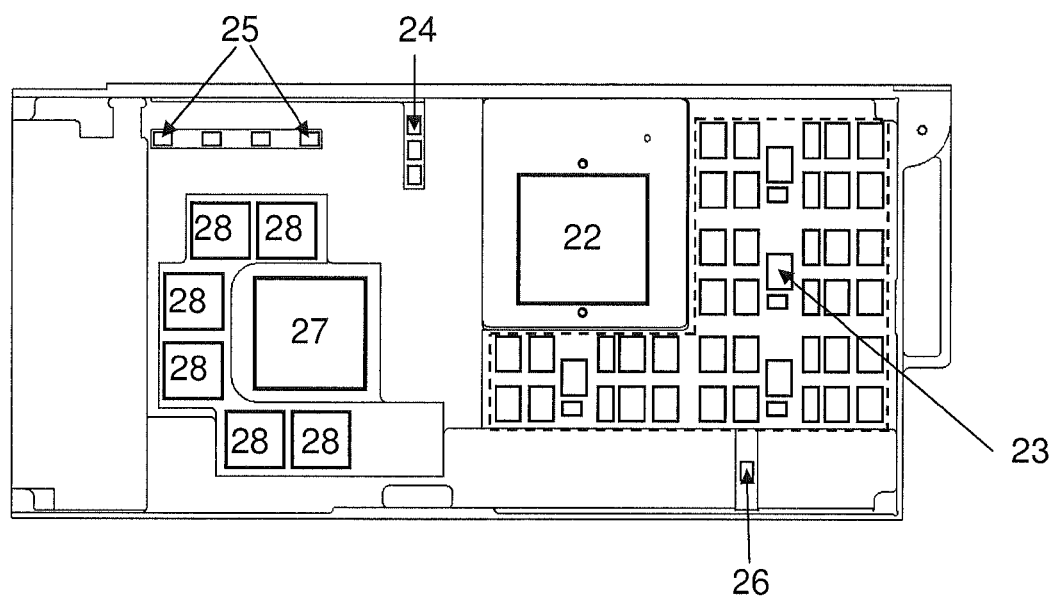
FIG. 3 illustrates an inside view of the housing from FIGS. 2A and 2B according to the invention.

In FIG. 3 are disclosed the areas on the inside of the housing corresponding to the heat collector where TIM has to be applied. Different kind of TIM can be used depending on the requirements. The TIM 22 on the area 12 to be in contact with the processor 2 is thermal grease which can be pressed to less than a mil thickness. It is typically applied with a stencil. The TIM 27, 28 on area 17, 18 for respectively the south bridge 7 and the interface modules 8 is either a very soft thermal pad or thermal grease with a very high viscosity. The TIM 24, 25, 26 on area 14, 15, 16 for the VRM chips 4, 5, 6 as well as the TIM 23 on area 13 for the memory modules 3 are either a thermal pad with relatively high conductance or thermal grease with very high viscosity while the most cost effective solution is thermal grease. It is applied with a stencil only where required. The use of a thermal grease applied using some stencil allow to apply only a fraction of such material in comparison to the use of TIM pad, a rather cost effective solution.

Figure 4:
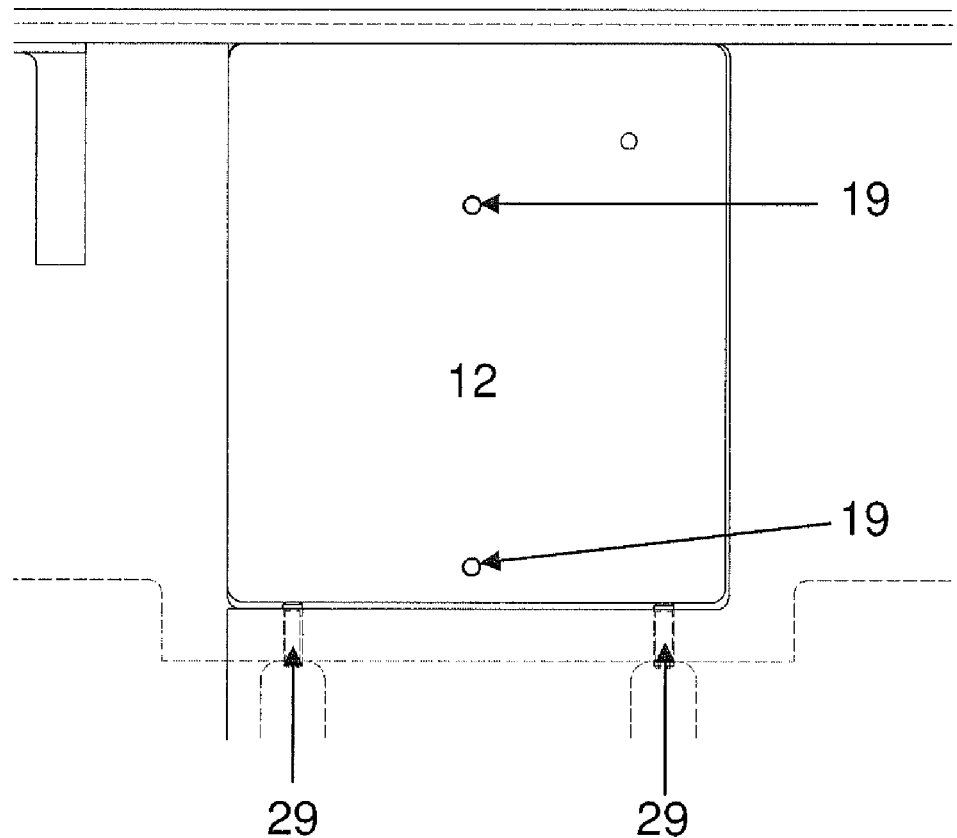
FIG. 4 illustrates a detailed view of the height adjustable heat collecting area from the heat collector according to the invention.

In FIG. 4 is a detailed view of a heat collecting area 12 adjustable in height as regard to the PCB 1. In the embodiment shown there, this heat collecting area 12 is made of a separate part to be fixed at the heat collector of the housing 10 made itself in one-piece material. The adjustable heat collecting area 12 fills a window opening in the housing 10. It is placed into the housing 10 and pressed against the PCB which is positioned at the housing supports 20, 21. The adjustable heat collecting area 12 is then locked in this position by two screws 29 which press it against the base portion 11 (cooling interface) of the housing 10. This adjustable heat collecting area 12 is small and simple to produce. It can be made out of some material which is hard to machine but has a significant higher thermal conductance than the housing material. Examples are cupper or pure aluminium. In contrast, the housing which is made in one-piece material with the heat collector can have much lower thermal conductance and be cast in some cheaper aluminium alloy.

Figure 5:
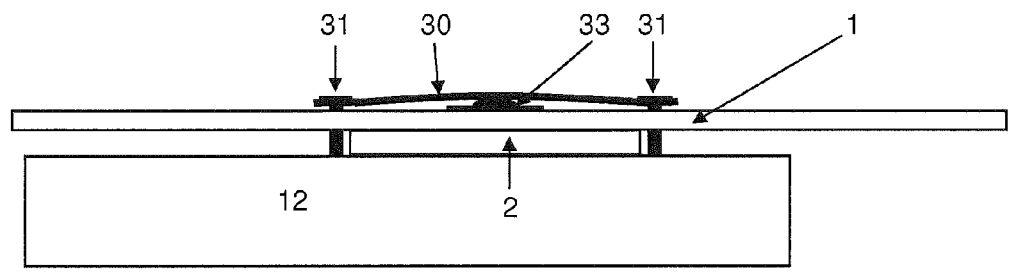
FIG. 5 illustrates a side view showing a spring mechanism for pressing the specific electronic component against the heat collector according to the invention.

In FIG. 5 is shown how the spring mechanism is implemented to optimize the thermal contact between the processor 2 (a very high heat emitting electronic component) and the corresponding heat collecting area 12. After installing the PCB 1 into the housing 10, the PCB is then attached using some leaf spring 30. This is achieved by screwing the leaf spring 30 using some screws 31 through holes of the PCB 1 in threads 19 (see FIG. 4) of the adjustable heat collecting area 12. The screws 31 are holding the spring 30 on top of some card stiffener 33 puts exactly at the middle of the processor module 2. The tightening by few turns of the screws 31 applies a pressure to the processor module 2 against the adjustable heat collecting area 12. The alignment to the adjustable heat collecting area 12 is perfect by applying the pressure only at one point in the middle to the processor module 2. Small anti-parallel tolerances of the module are compensated by bending the processor card slightly. The amount the card has to be bent in this case is well in the allowed range. The screws 31 are the only points where the card is held in the housing. Therefore, small movements of the processor card in the housing are possible when it is plugged into the back plane. As an example, the self adjustment of the node processor card described above requires a tolerance of 6 mil.

Figure 6:
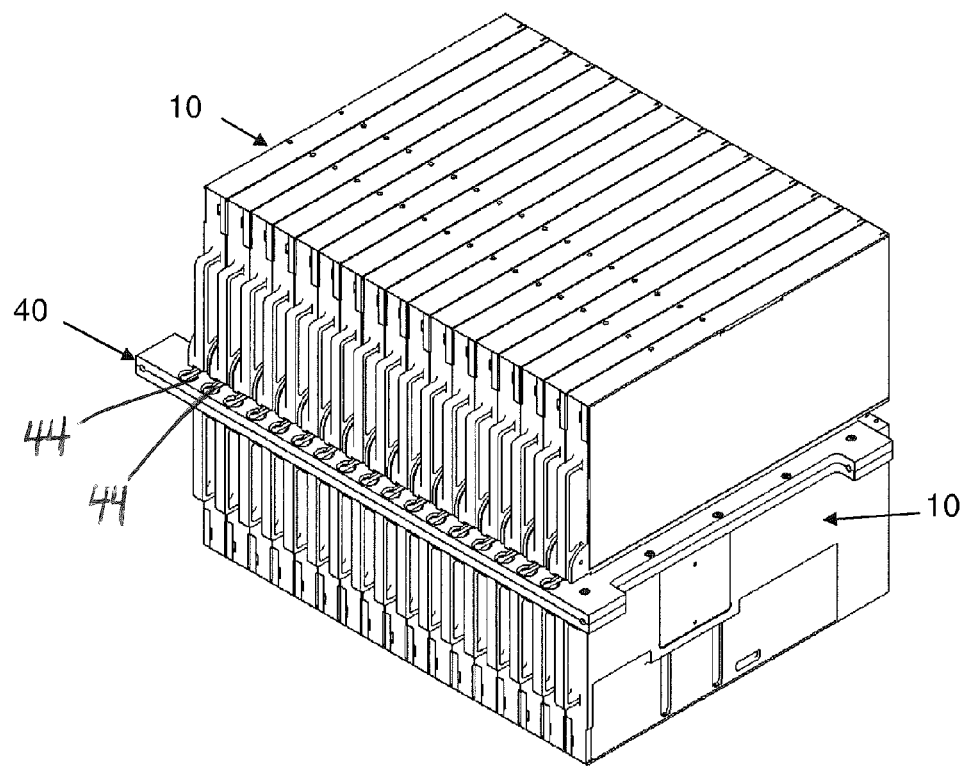
FIG. 6 illustrates a small cluster with thirty four processor assembly according to the invention.
Figure 7:
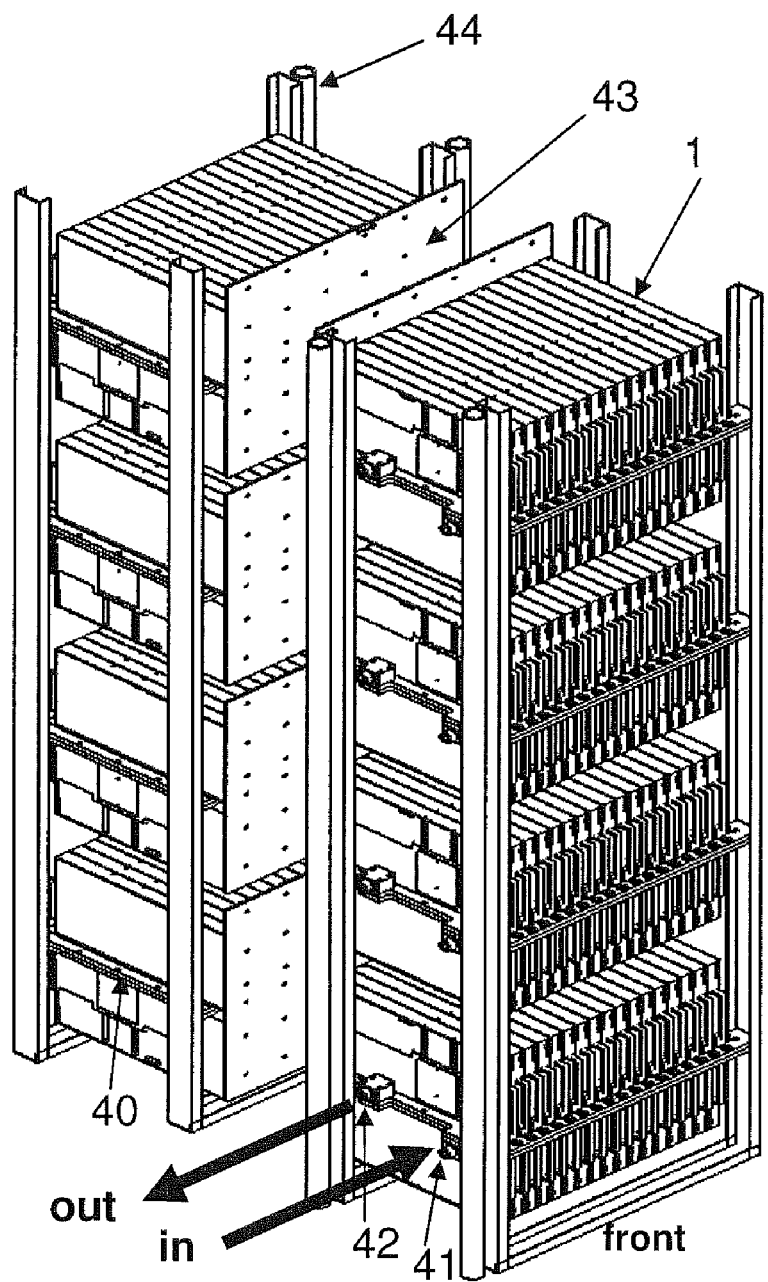
FIG. 7 illustrates an electronics rack with a plurality of systems for cooling processor assembly according to the invention.

In FIG. 6 is shown cluster of thirty-four processor systems, i.e., PCBs with their respective housings 10 according to the invention which are clamped on a cooling plate 40. Such assembly shows the advantage of such kind of heat collector which transfers all the heat to be evacuated from the heat emitting electronic components via the base portion 11 of the housing 10 (see FIG. 2B) to the cooling plate 40. Such cooling plate being partly hollow with manifolds 44 can be advantageously cooled using some liquid coolant distributed within it. In FIG. 7 is shown a stack of such clusters with the different cooling plates 40 and their inlet 41 as well as outlet 42 for the liquid coolant distribution. Such liquid coolant is able to carry out heat transferred from the base portion 11 of the housing 10 to the cooling plate 40. The stack as shown in FIG. 7 is an example of a super computer consisting on eight cooling plates 40, each four in an electronics rack or supercomputer frame 44. Four are in the front and four are in the back in vis-á-vis from their back plane 43. On each cooling plate 40 sit 32 processor nodes and two controller nodes. The back plane 43 is perpendicular to the cooling plate 40 and to the base portion of the housing 11 (see FIG. 2B). Only a small tolerance exists between the back plane 43 and the cooling plate 40. This is compensated by allowing the PCB to move into the housing since only fixed through the two screws 31

(see FIG. 5). A tiny move is sufficient to adjust the card when the processor node is plugged into the back plane.

The controller nodes have a similar housing as the processor nodes. They sit in the middle position on each side of the cooling plates 40. The two manifolds which supply the cooling plates 40 with liquid coolant (water) are not shown. They are mounted on the side of the rack at the front and at the back. The liquid coolant gets into the cooling plates 40 via the inlet connector 41 to leave them via outlet connector 42 carrying heat outside the cooling plates 40.

Figure 8:
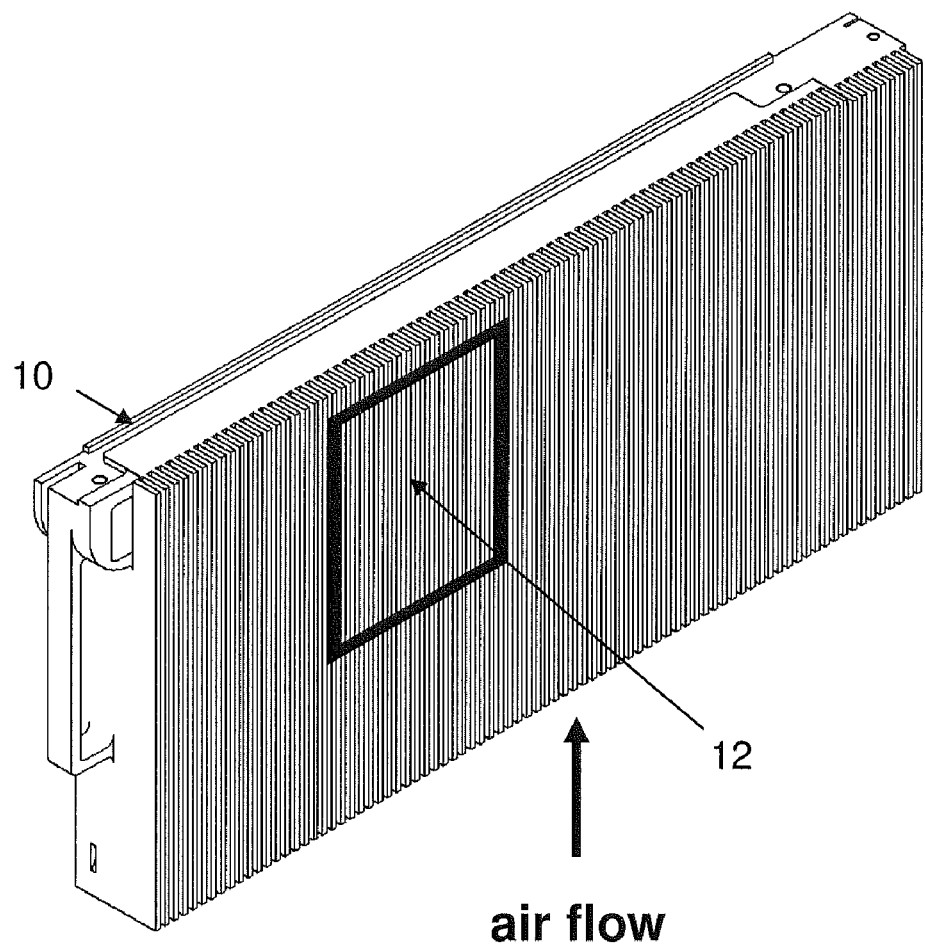
FIG. 8 illustrates a side view of a housing for processor assembly according to an alternative embodiment of the invention.

In FIG. 8 is shown an alternative for cooling the housing 10 of the PCB. In this case, no cooling plates as in the example of FIGS. 6 and 7 are required. This is achieved by adding to the main external surface of the housing 10 fins. In such a way, the cooling surface can be five times larger than without the fins. The heat collected by the housing along the fins will then be evacuated by some air flow applied parallel to the fins.

REFERENCES

1 PCB or processor node;
2 processor;
3 memory modules;
4 chips
5 voltage regulator modules (VRM)
6 VRM;
7 south bridge;
8 interface modules;
9 connector area;
10 housing;
11 base portion of the housing;
12 heat adjustable area;
13-18 specific housing areas;
19 thread;
20, 21 housing support;
22-28 different areas with TIM;
30 spring;
31 screw;
33 card stiffener;
40 cooling plate;
41 inlet connector;
42 outlet connector;
43 back plane;
44 supercomputer frame.

What is claimed is:

1. A system for cooling processor assembly, comprising:
    a printed circuit board (PCB) with a plurality of heat emitting electronic components; and
    a housing for the PCB comprising a heat collector, wherein the heat collector is constructed in one-piece material covering the plurality of heat emitting electronic components through heat collecting areas with different heights adapted to the different heights of the electronic components as regard to the PCB surface and wherein the heat collecting areas is in thermal contact with the electronic components;
    wherein the heat collector comprises at least a heat collecting area adjustable in height with respect to the PCB surface and to be pressed against a specific electronic component of the PCB, the heat collecting area comprising a separate part fixed at the heat collector once adjusted against the specific electronic component.

2. The cooling system according to claim 1 wherein the adjustable heat collecting area is pressed against the specific electronic component using a leaf spring placed on the back of the PCB on the height of the specific electronic component and fixed using at least a screw going through the PCB to be inserted into a thread at the adjustable heat collecting area, the tightening of the screw pressing the adjustable heat collecting area against the specific electronic component in thermal contact allowing an optimal heat transfer from the specific electronic component towards the heat collector.

3. The cooling system according to claim 1 wherein the heat collector comprises an external base portion to which is transferred heat emitted by the electronic components and which is put into thermal contact with a cooling plate removing heat from the heat collector.

4. The cooling system according to claim 3 wherein the cooling plate being partly hollow with manifolds for a liquid distribution to carry out heat transferred from the base portion of the housing to the cooling plate.

5. The cooling system according to claim 1 wherein the heat collector comprises an external surface with cooling fins.

6. An electronics rack with a plurality of systems for cooling processor assembly, each system comprising:
    a printed circuit board (PCB) with a plurality of heat emitting electronic components; and
    a housing for the PCB comprising a heat collector, wherein the heat collector is constructed in one-piece material covering the plurality of heat emitting electronic components through heat collecting areas with different heights adapted to the different heights of the electronic components as regard to the PCB surface and wherein the heat collecting areas being in thermal contact with the electronic components;
    wherein the heat collector comprises at least a heat collecting area adjustable in height with respect to the PCB surface and to be pressed against a specific electronic component of the PCB, the heat collecting area comprising a separate part fixed at the heat collector once adjusted against the specific electronic component.

7. The rack according to claim 6 wherein the adjustable heat collecting area is pressed against the specific electronic component using a leaf spring placed on the back of the PCB on the height of the specific electronic component and fixed using at least a screw going through the PCB to be inserted into a thread at the adjustable heat collecting area, the tightening of the screw pressing the adjustable heat collecting area against the specific electronic component in thermal contact allowing an optimal heat transfer from the specific electronic component towards the heat collector.

8. The rack according to claim 6 wherein the heat collector comprises an external base portion to which is transferred heat emitted by the electronic components and which is put into thermal contact with a cooling plate removing heat from the heat collector.

9. The rack according to claim 8 wherein the cooling plate being partly hollow with manifolds for a liquid distribution to carry out heat transferred from the base portion of the housing to the cooling plate.

10. The rack according to claim 6 wherein the heat collector comprises an external surface with cooling fins.

* * * * *